United States Patent [19]
Liaw et al.

[11] Patent Number: 6,137,122
[45] Date of Patent: Oct. 24, 2000

[54] LATCH-UP CONTROLLABLE INSULATED GATE BIPOLAR TRANSISTOR

[75] Inventors: Chorng-Wei Liaw, Huwei Jen; Ming-Jang Lin, Taiping Shiang; Tian-Fure Shiue, Judung Jen; Huang-Chung Cheng; Ching-Hsiang Hsu, both of Hsinchu; Wei-Jye Lin, Chaujou Jen; Hau-Luen Tien, Taipei, all of Taiwan

[73] Assignee: Analog and Power Electronics Corp., Hsinchu, Taiwan

[21] Appl. No.: 09/453,758

[22] Filed: Dec. 2, 1999

[51] Int. Cl.$^7$ .......................... H01L 29/74; H01L 31/111; H01L 29/76; H01L 29/94; H01L 31/062

[52] U.S. Cl. .......................... 257/132; 257/133; 257/137; 257/138; 257/330; 257/331; 257/332; 257/378

[58] Field of Search .................................... 257/132, 133, 257/137, 138, 330, 331, 332, 378

[56] References Cited

U.S. PATENT DOCUMENTS 5,689,121  11/1997  Kitagawa et al. ....................... 257/139
5,861,638  1/1999  Oh ............................................ 257/133

*Primary Examiner*—Ngân V. Ngô
*Attorney, Agent, or Firm*—Thomas, Kayden, Horstemeyer & Risley

[57] ABSTRACT

A latch-up controllable insulated gate bipolar transistor is formed with a thyristor structure, which has a first region of a first conductivity type, a second region of a second conductivity type formed on the first region, a third region of the first conductivity type formed on the second region, and a fourth region of the second conductivity type contacting the third region and forming a P-N junction therewith. The first and third regions contact a first and second electrode regions respectively. A first field effect transistor means for controlling conduction between the fourth region and the second region in response to an actuation bias; and a second field effect transistor means between the fourth region and the second electrode region for turning the thyristor off in response to a cutoff bias. The insulated gate bipolar transistor of the present invention are latch-up controllable, of a high voltage withstand and of a lower forward voltage drop simultaneously

14 Claims, 6 Drawing Sheets

6,137,122

LATCH-UP CONTROLLABLE INSULATED GATE BIPOLAR TRANSISTOR

FIELD OF THE INVENTION

The present invention relates to a power electronic device in general and more particularly to a latch-up controllable insulated gate bipolar semiconductor element.

BACKGROUND OF THE INVENTION

The development of semiconductor switching technology for high power applications, such as in motor drive circuits and lighting ballasts, began with the bipolar junction transistor (BJT). Although BJT's can meet various requirements, there exist several fundamental drawbacks to the suitability of BJT's for all high power applications. For example, BJT's are current controlled devices, which makes the base drive circuitry complex and expensive. Furthermore, the input impedance of BJT's is too low. The power MOSFET was developed to overcome the existing problems. In a power MOSFET, a gate electrode bias is applied for turn-on and turn-off control. Despite power MOSFET devices have many advantages, these benefits are offset by the high ON-resistance of their active region, which arises from the absence of minority carrier injection. As a result, the device's operating forward current density is limited to relatively low values, as compared to that for the BJT. On the basis of these features of power BJT's and MOSFET devices, hybrid devices embodying a combination of bipolar current conduction with MOS-controlled current flow were developed and found to provide significant advantages over single technologies such as bipolar or MOSFET alone. Insulated gate bipolar transistor (IGBT) and emitter switched thyristor (EST) are two of them.

A typical IGBT comprises, as shown in FIG. 1, a P+ collector region 10, an N+ buffer layer 12, an N−drift layer 14, a P-type base region 16 and an N+ emitter region 18. A gate 20 is disposed above the base region 16, and a gate oxide 22 is formed therebetween. Two metal layers 24 and 26 are formed as emitter and collector electrode regions, respectively. Although IGBT's suffer a lower ON loss due to their conductivity modulation in drift region over using bipolar or MOSFET devices alone, even lower conduction losses can be expected by using a thyristor since thyristors offer a higher degree of conductivity modulation and a lower forward voltage drop when turned on.

FIG. 2 schematically shows an EST, which comprises a P+ anode region 30, an N+ buffer layer 32, an N−drift layer 34, a P-type base region 36, an N+ floating region 38 and an N+ cathode region 40. A gate 42 is provided above a region between the floating region 38 and the cathode region 40, and a gate oxide 44 is inserted therebetween. Metal layers 24 and 26 serve as cathode and anode electrode regions, respectively. Unfortunately, latch-up may be sustained for high current applications due to a parasitic thyristor thereof, which can result in device failure if the latch-up current is not otherwise sufficiently controlled by external circuitry.

The latch-up can be inhibited with a trench IGBT, which is shown in FIG. 3. However, its conductivity impedance modulation is not comparable to an EST, and the trench related to the gate 20' is subjected to a higher voltage. On the other hand, the latch-up is inevitable, since an EST cannot be provided with a trench gate.

Endeavors have been made to overcome the disadvantages of IGBT's or EST's. Bauer et al. utilizes a recombination layer buried in an IGBT in U.S. Pat. No. 4,985,741 to avoid latch-up. Sakurai suppresses latch-up in an IGBT with U.S. Pat. No. 5,089,864. Fujihira et al. in U.S. Pat. No. 5,097,302 detects the load current to avoid IGBT burnout. Sakurai improves conductivity modulation of an IGBT in U.S. Pat. No. 5,200,632. Hiraki et al. and Iwamura reduce conduction impedance by increasing trench depth in U.S. Pat. No. 5,282,018 and by using double gates in U.S. Pat. No. 5,659,185, respectively. Baliga in U.S. Pat. No. 5,306,930 and Shekar et al. in U.S. Pat. Nos. 5,293,054 and 5,294,816 disclose various mechanisms to suppress latch-up of parasitic thyristors in EST's. Otsuki et al. integrates IGBT with EST in U.S. Pat. No. 5,378,903. Shekar et al. uses a dual-channel trench FET to suppress EST latch-up in U.S. Pat. No. 5,471,075. Salurai et al., Seki and Iwamura use a dual-gate to switch between thyristor structure and IGBT to reduce conduction voltage drop in U.S. Pat. Nos. 5,459,339, 5,349,212 and 5,644,150, respectively. Ajit removes parasitic thyristor from an EST in U.S. Pat. No. 5,719,411. Oh in U.S. Pat. No. 5,844,285 makes hole current into the cathode of a thyristor before they flow into the primary emitter to prevent the parasitic thyristor from being turned on. However, these prior arts cannot overcome all of the above-mentioned problems or may cause other disadvantages. Therefore, it is desired a bipolar transistor of a high input impedance, a low conduction voltage drop, a high voltage withstand, with a high current density, and free from damaged by latch-up.

SUMMARY OF THE INVENTION

In view of the disadvantages mentioned above, the present invention provides a latch-up controllable insulated gate bipolar transistor comprising a thyristor structure. In particular, the thyristor has a first region of a first conductivity type, a second region of a second conductivity type formed on the first region, a third region of the first conductivity type formed on the second region, and a fourth region of the second conductivity type contacting the third region and a P-N junction formed therewith. The first and third regions contact a first and second electrode regions, respectively. Two field effect transistor structures are used to control ON/OFF of the thyristor. The first field effect transistor controls the conduction between the fourth region and the second region in response to an actuation bias. The second field effect transistor between the fourth region and the second electrode region turns the thyristor off in response to a cutoff bias.

Both of the field effect transistors can use planar gates or trench gates. The thyristor constructed by the first to fourth regions is conducted when the two field effect transistors are turned on, and the voltage drop thereacross is remarkably low. On the other hand, the electron flow path of the thyristor can be cut by switching the gate voltage of the second field effect transistor, which causes the thyristor to turn off. As a result, latch-up is under controlled. Thus, the present invention can achieve a high voltage withstand, a low conduction voltage drop, a high conduction current density and a latch-up controllability for power semiconductor devices.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION

Figure 1:
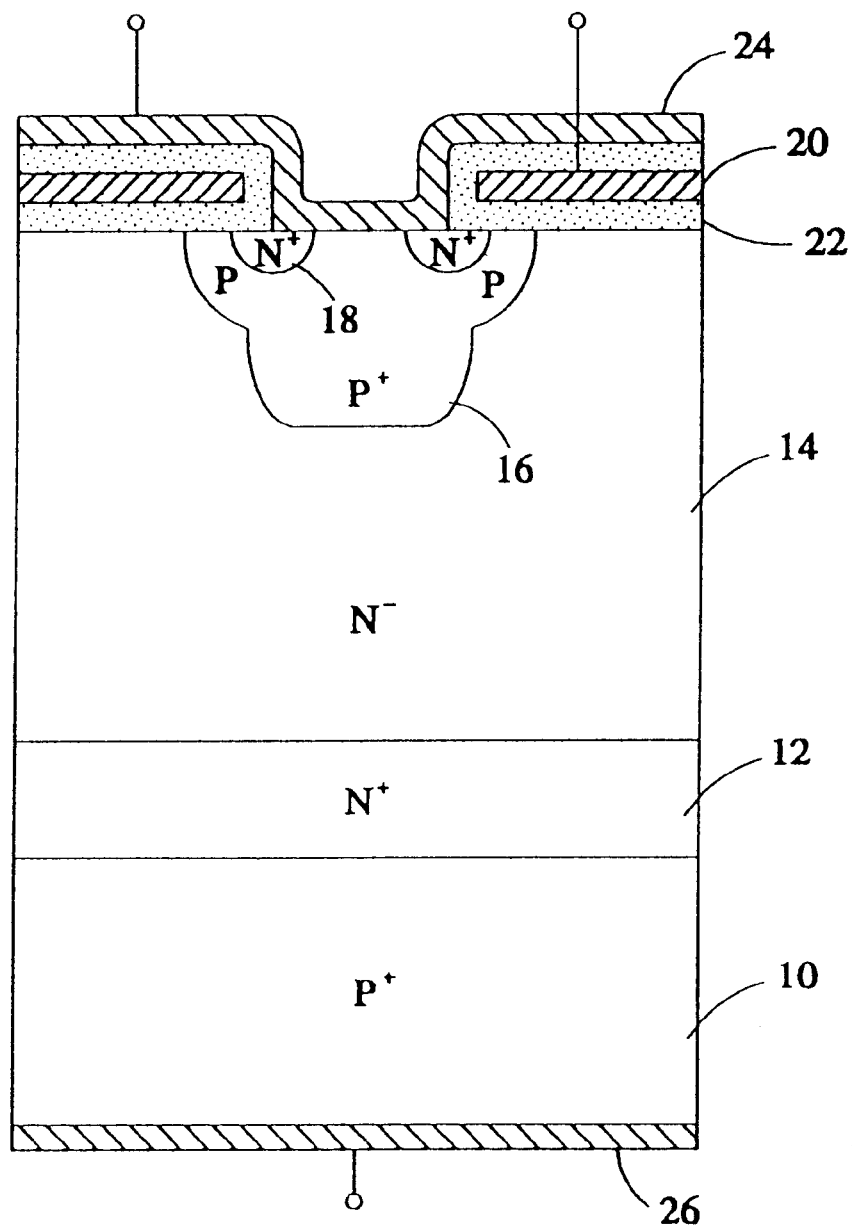
FIG. 1 is a cross sectional view of a typical IGBT.
Figure 2:
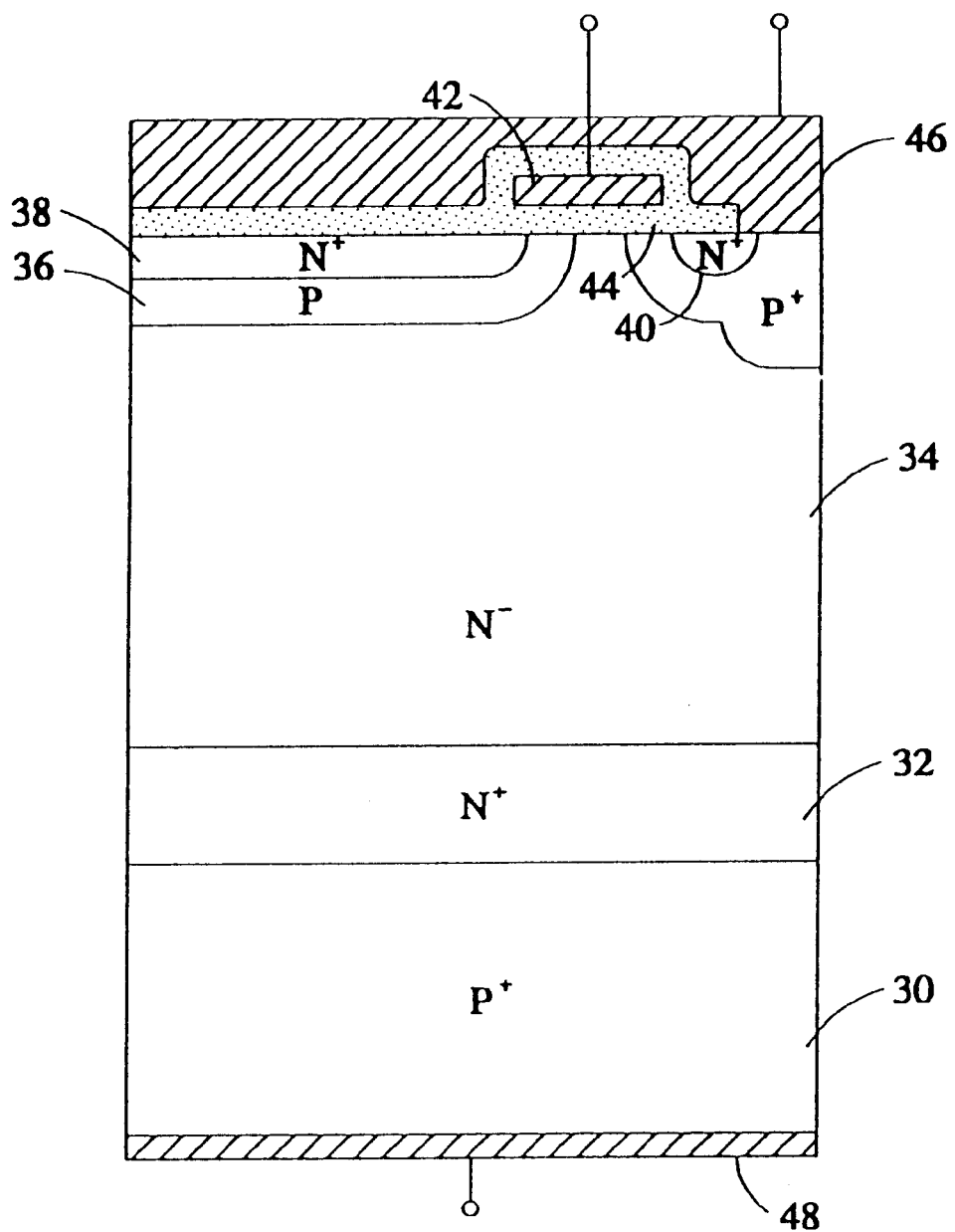
FIG. 2 is a cross sectional view of a conventional EST.
Figure 3:
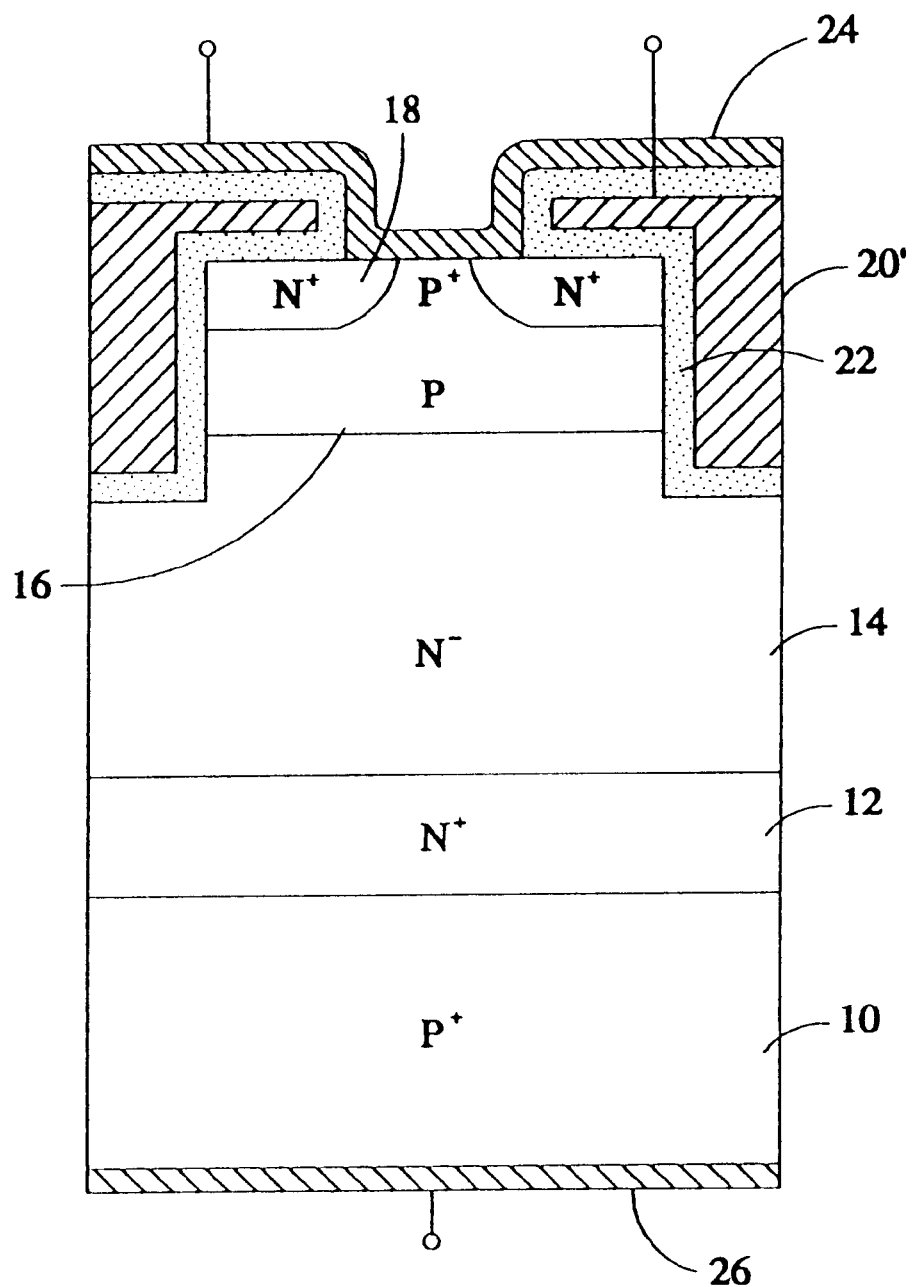
FIG. 3 is a cross sectional view of a conventional trench IGBT.
Figure 4:
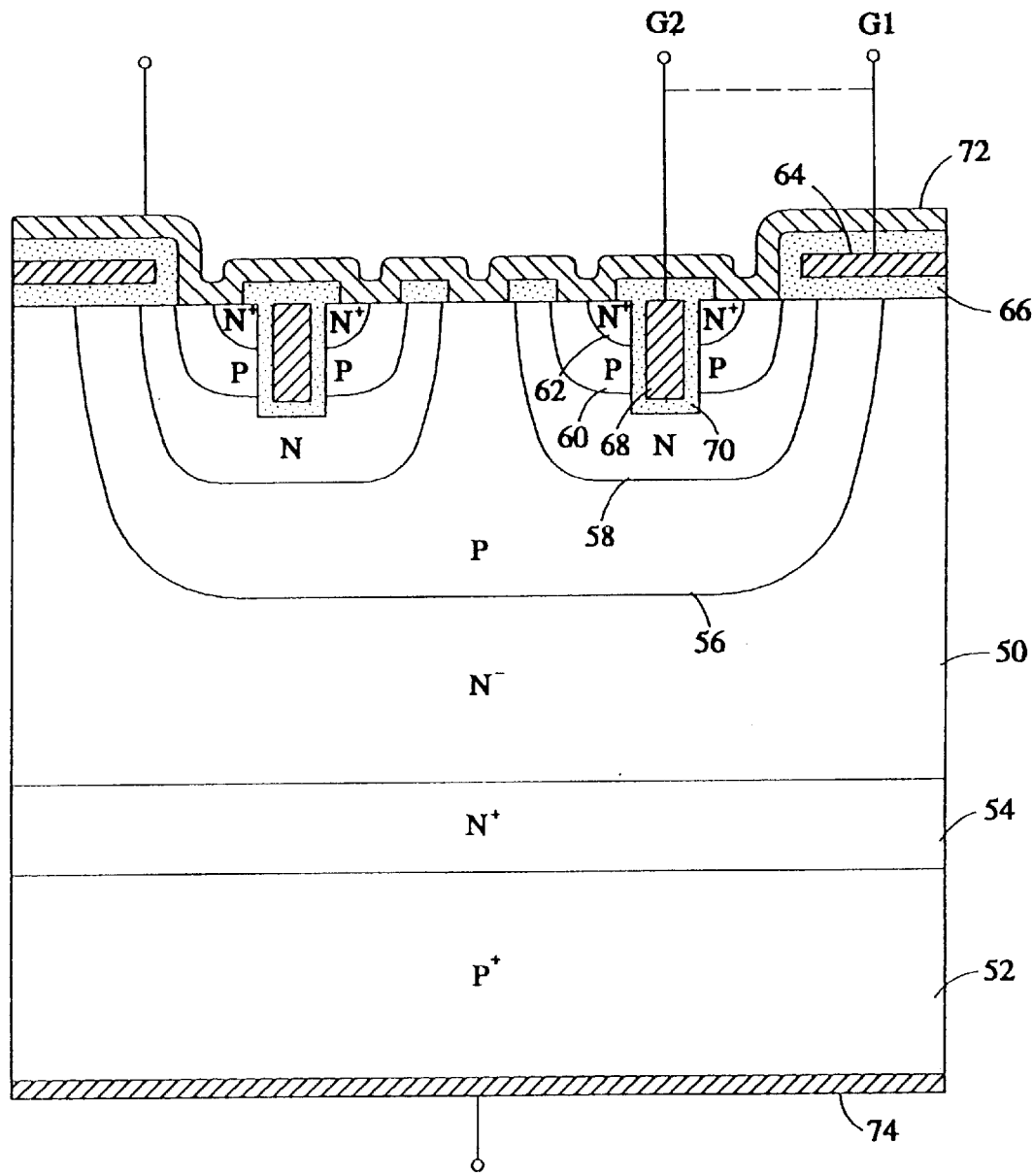
FIG. 4 is a cross sectional view of a preferred embodiment of the present invention.

FIG. 4 is a cross sectional view of a preferred embodiment of the present invention. This device is formed by depositing an N⁻ drift layer 50 on a P⁺ substrate 52, and an N⁺ buffer layer 54 is formed between the drift layer 50 and the substrate 52, as in a well-known IGBT or EST. The other side of the drift layer 50 is formed with a P-type well 56, and then a well 58 and a P-type base region 60 of opposite conductivity types are sequentially formed in the P-type well 56. An N⁺ region 62 is further formed on the P-type base region 60. A planar gate 64 is formed above an top surface of the P-type well 56. An insulation layer 66 is inserted between the gate 64 and the P-type well 56. The surface region of the P-type well 56 adjacent to the gate 64 served as a channel under controlled by the gate 64.

Another control means for this device is with a trench gate 68. The trench is formed from a surface of the N⁺ region 62 through the N⁺ region 62 and the P-type base region 60 into the N⁻ type well 58. The trench has a bottom surface and a sidewall around on which insulation layer 70 is formed such that a channel controlled by the gate 68 is obtained outside of the trench sidewall. As shown in this embodiment, the gates 64 and 68 are connected to a common electrode signal, which can be achieved by connecting a conductive layer (not shown) with the gates 64 and 68 and is obvious to those skilled in the integrated circuit technology. In another embodiment, gates 64 and 68 can be controlled by electrodes G1 and G2 respectively to obtain different control with the transistors.

Finally, metal layers 72 and 74 are formed as electrode regions at top and bottom respectively. The first electrode region 72 contacts the P-type well 56, the P-type base region 60 and the N⁺ region 62, while the second electrode region 74 contacts the P⁺ substrate 52.

Now, the operation principle and process thereof is described. When the gate electrode G1/G2 is applied with a suitable voltage to turn on the channels in conjunction with the gates 64 and 68 such that electrons are injected from the N⁺ region 62 through the channel related to the gate 68 to the N-type well 58, and then through the channel under the gate 64 to the drift layer 50. On the other hand, holes flows in the direction opposite to the electron path. They are injected from the drift layer 50 to the P-type well 56, and discharged from the metal contact of the P-type well 56, causing the junction between the P-type well 56 and the N-type well 58 forward biased. Therefore, a thyristor consisting of the substrate 52, drift layer 50, P-type well 56 and N-type well 58 is conducted, so that latch-up occurs and the voltage drop thereof is very low. Alternately, the thyristor can be turned off by switching the gate 68 to cut the electron flow path. In other words, the insulated gate bipolar transistor are latch-up controllable.

In comparison with a trench IGBT, the transistor provided by the present invention does not need a trench withstanding a high voltage and has a lower conduction voltage drop. In comparison with an EST, the transistor provided by the present invention not only has a lower conduction voltage drop but also avoids uncontrollable latch-up, which will result in burnout.

However, in FIG. 4 an embodiment with a P-type substrate is used for the semiconductor device, but an N-type substrate can be used instead. In the latter case, the N-type substrate is used as a drift layer, and an N⁺ buffer layer and a P⁺ layer are sequentially formed on the back thereof. The other side of the N-type substrate is formed as described in the previous embodiment.

As known from FIG. 4, according to the present invention, the latch-up controllable insulated gate bipolar transistor comprises a thyristor structure and two field effect transistor structure. The gate 64 electrically connects the N-type well 58 to the drift layer 50 through the channel in response to a actuation bias. The other field effect transistor is between the electrode region 72 and the N-type well 58, and the gate 68 thereof can block the electron flow path of the thyristor in response to a cutoff bias, causing the thyristor to be turned off, thereby uncontrollable latch-up is avoided.

Figure 5:
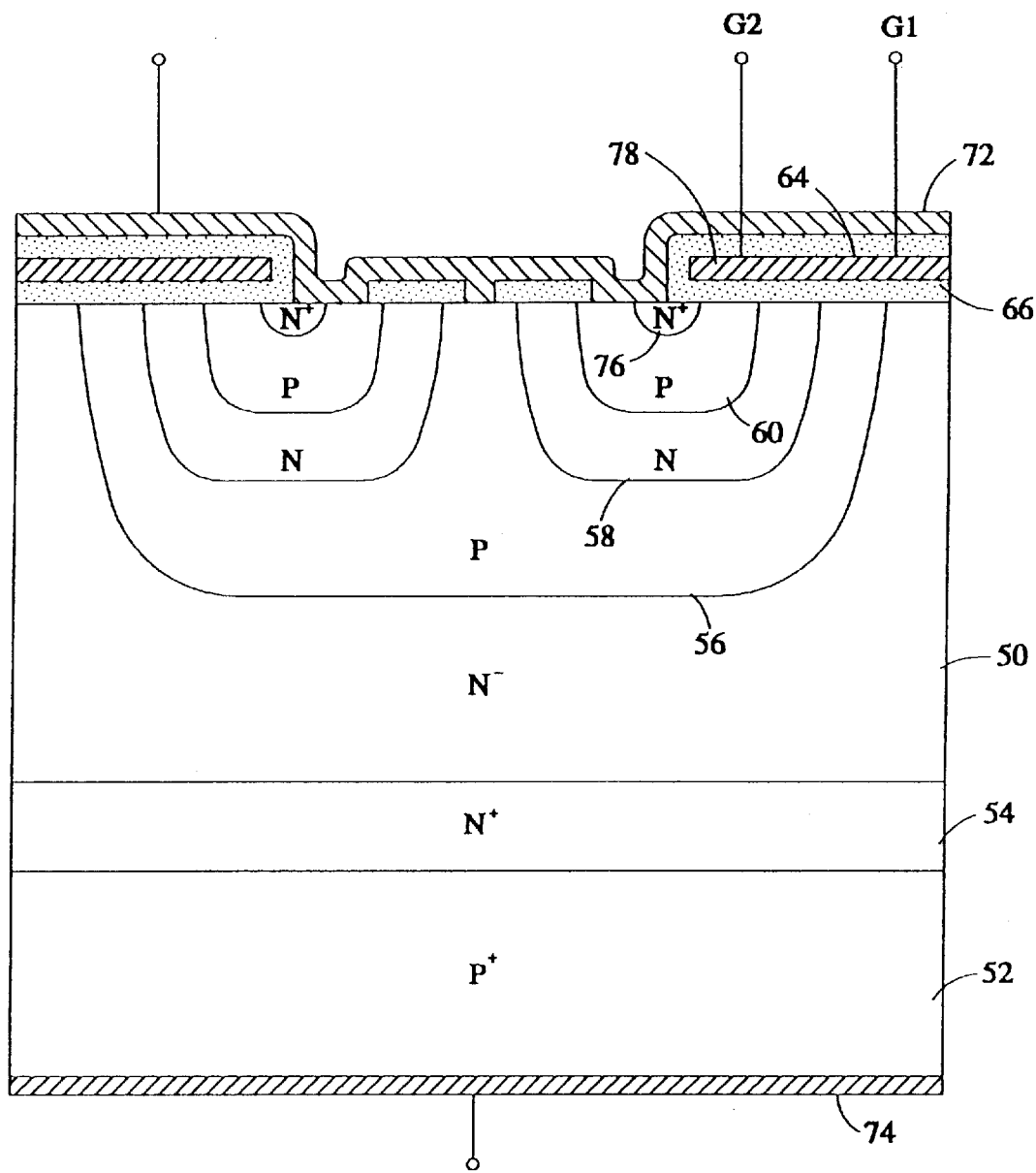
FIG. 5 is a cross sectional view of another embodiment of the present invention.
Figure 6:
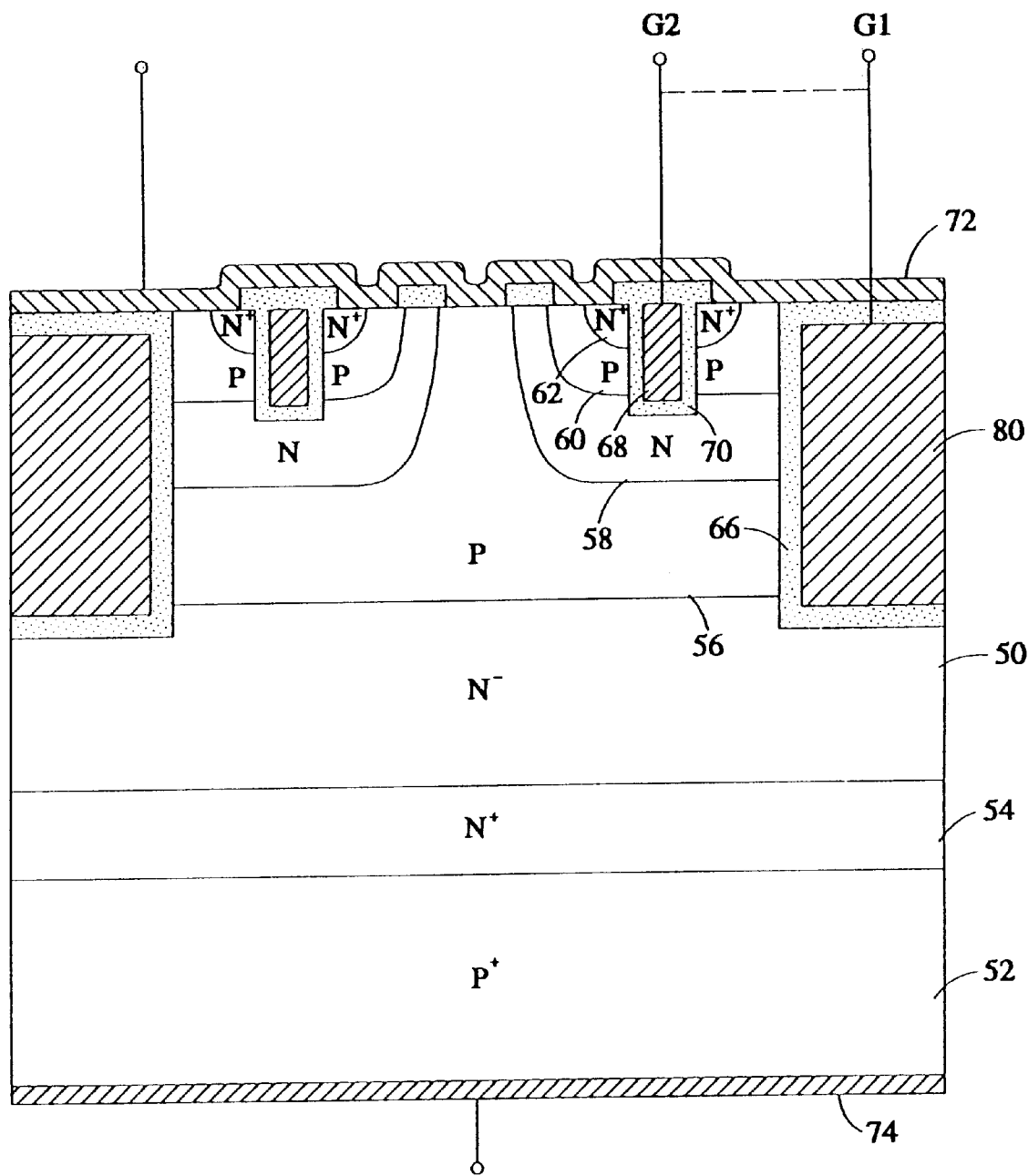
FIG. 6 is a cross sectional view of a further embodiment of the present invention.

To cut the electron flow path of the thyristor, the second field effect transistor can also utilizes a planar gate. FIG. 5 is a cross sectional view of another embodiment showing the case. In this device, a thyristor and a first field effect transistor are the same as those shown in FIG. 4, while a second field effect transistor with a planar gate 78 is used. The gate 78 is above the P-type base region 60 and controls the channel between the N⁺ region 76 and the N-type well 58. The gates 64 and 78 can be formed from the same layer of polysilicon to simplify the fabrication process further. Although the planar gate 64 is used in the embodiments mentioned above, it is apparent to those skilled in the art that the planar gate 64 can be replaced with a trench gate 80 as shown in FIG. 6, in which gates 68 and 80 of two field effect transistors are both trench gates.

From the above, it should be understood that the embodiments described, in regard to the drawings, are merely exemplary and that a person skilled in the art may make variations and modifications to the shown embodiments without departing from the spirit and scope of the present invention. All variations and modifications are intended to be included within the scope of the present invention as defined in the appended claims.

What is claimed is:

1. A latch-up controllable insulated gate bipolar transistor comprising:
    a first semiconductor region of a first conductivity type having a first and a second surfaces;
    a second semiconductor region of a second conductivity type opposite to the first conductivity type on the first surface side of the first semiconductor region;
    a third semiconductor region of the second conductivity type on the second surface side of the first semiconductor region;
    a fourth semiconductor region of the first conductivity type formed on the third semiconductor region;
    a fifth semiconductor region of the second conductivity type formed on the fourth semiconductor region;
    a sixth semiconductor region of the first conductivity type formed on a surface of the fifth semiconductor region;
    a first gate for forming a first field effect transistor with the first, third and fourth semiconductor regions;
    a second gate in a trench for forming a second field effect transistor with the fourth, fifth and sixth semiconductor regions;
    a first electrode region contacting the third, fifth and sixth semiconductor regions; and
    a second electrode region contacting the second semiconductor region.

2. An insulated gate bipolar transistor according to claim 1, wherein a portion of the first semiconductor region adjacent to the second semiconductor region is heavily doped.

3. An insulated gate bipolar transistor according to claim 1 further comprising means for electrically connecting the first and second gates.

4. An insulated gate bipolar transistor according to claim 1, wherein the second gate is a planar gate.

5. An insulated gate bipolar transistor according to claim 1, wherein the second gate is a trench gate.

6. A latch-up controllable insulated gate bipolar transistor formed of semiconductor material comprising:

a first region of a first conductivity type;

a second region of a second conductivity type opposite to the first conductivity type formed on the first region;

a first well of the first conductivity type formed in the second region;

a second well of the second conductivity type formed in the first well;

a third region of the first conductivity type formed in the second well;

a fourth region of the second conductivity type formed on top of the third region;

a first gate formed above a surface of the first well between the second region and the second well for forming a first field effect transistor with the first and second wells and the second region;

a second gate formed in a trench for forming a second field effect transistor with the second well and the third and fourth regions;

a first electrode layer contacting the first well and the third and fourth regions; and a second electrode layer contacting the first region.

7. An insulated gate bipolar transistor according to claim 6, wherein a portion of the second region adjacent to the first region is heavily doped.

8. An insulated gate bipolar transistor according to claim 6 further comprising means for electrically connecting the first and second gates.

9. A latch-up controllable insulated gate bipolar transistor formed on a semiconductor substrate comprising:

a thyristor formed of a first region of a first conductivity type, a second region of a second conductivity type opposite to the first conductivity type, a third region of the first conductivity type, and a fourth region of the second conductivity type contacting the third region and forming a P-N junction therewith, the first region and the third region contacting a first electrode region and a second electrode region respectively;

a first field effect transistor means having a first gate for controlling conduction between the fourth region and the second region in response to an actuation bias; and a second field effect transistor means, having a second gate, between the fourth region and the second electrode region for turning the thyristor off in response to a cutoff bias.

10. An insulated gate bipolar transistor according to claim 9, wherein the first gate is a planar gate.

11. An insulated gate bipolar transistor according to claim 9, wherein the first gate is a trench gate.

12. An insulated gate bipolar transistor according to claim 9, wherein the second gate is a planar gate.

13. An insulated gate bipolar transistor according to claim 9, wherein the second gate is a trench gate.

14. An insulated gate bipolar transistor according to claim 9 further comprising means for electrically connecting the first and second gates.

* * * * *